US008174133B2

(12) United States Patent
Pang et al.

(10) Patent No.: US 8,174,133 B2
(45) Date of Patent: May 8, 2012

(54) ENVIRONMENT FRIENDLY REMOTE CONTROL

(75) Inventors: Kim Suan Pang, Singapore (SG); Vinod Menon, Johor Bahru (MY)

(73) Assignee: Thomson Licensing, Boulogne, Billancourt (FR)

(*) Notice: Subject to any disclaimer, the term of this patent is extended or adjusted under 35 U.S.C. 154(b) by 411 days.

(21) Appl. No.: 12/583,638

(22) Filed: Aug. 24, 2009

(65) Prior Publication Data

US 2010/0052332 A1 Mar. 4, 2010

(30) Foreign Application Priority Data

Aug. 28, 2008 (EP) .................................... 08305506

(51) Int. Cl.

| | |
|---|---|
| ***F02B 63/04*** | (2006.01) |
| ***F03G 7/08*** | (2006.01) |
| ***H02K 7/18*** | (2006.01) |
| *H01L 41/00* | (2006.01) |
| *H02N 2/00* | (2006.01) |

(52) U.S. Cl. ......... 290/1 R; 310/339; 340/4.41; 341/176

(58) Field of Classification Search .................. 290/1 R; 310/339; 341/176; 340/4.41
See application file for complete search history.

(56) References Cited

U.S. PATENT DOCUMENTS

| | | | | | |
|---|---|---|---|---|---|
| 4,857,898 | A * | 8/1989 | Smith | ............................. | 341/22 |
| 5,168,471 | A * | 12/1992 | Parra | ............................... | 367/99 |
| 5,237,327 | A * | 8/1993 | Saitoh et al. | .................. | 341/176 |
| 5,537,107 | A * | 7/1996 | Funado | ...................... | 348/211.4 |
| 5,583,491 | A * | 12/1996 | Kim | ........................... | 340/13.31 |
| 5,847,336 | A * | 12/1998 | Thornton | ...................... | 200/5 A |
| 6,002,450 | A * | 12/1999 | Darbee et al. | ................. | 348/734 |
| 6,211,870 | B1 * | 4/2001 | Foster | ........................... | 715/744 |
| 6,278,499 | B1 * | 8/2001 | Darbee et al. | ................. | 348/734 |
| 6,587,067 | B2 * | 7/2003 | Darbee et al. | ................. | 341/176 |
| D482,006 | S * | 11/2003 | Stekelenburg | ............... | D13/168 |
| 6,771,182 | B1 * | 8/2004 | Loh et al. | ................... | 340/12.28 |
| 6,794,992 | B1 * | 9/2004 | Rogers | .......................... | 341/176 |
| 6,798,359 | B1 * | 9/2004 | Ivancic | ........................... | 341/23 |
| 7,034,712 | B2 * | 4/2006 | Rogers | .......................... | 340/4.41 |
| 7,170,442 | B2 * | 1/2007 | Lovberg et al. | ............... | 342/179 |
| 7,294,794 | B2 * | 11/2007 | Choi et al. | .................... | 200/5 A |
| 7,345,592 | B2 * | 3/2008 | Rogers | .......................... | 340/4.41 |
| 7,907,060 | B2 * | 3/2011 | Reams | ..................... | 340/636.15 |
| 8,009,054 | B2 * | 8/2011 | Reams | ..................... | 340/636.15 |

(Continued)

FOREIGN PATENT DOCUMENTS

DE 197 21 001 C1 10/1998

(Continued)

OTHER PUBLICATIONS

Search report dated Mar. 16, 2009.

*Primary Examiner* — Pedro J Cuevas
(74) *Attorney, Agent, or Firm* — Jeffrey D. Carter

(57) ABSTRACT

A remote control is suggested, which comprises an electric signal transmitter being supplied with energy from an electrical energy storage device. The remote control comprises a generator for converting mechanical energy into electrical energy to be stored in the electrical energy storage device. The remote control is provided with a display indicating an empty electrical energy storage device. The display informs the user immediately and unambiguously about the situation that he has to recharge the energy storage of the remote control before he tries to send out a command in vain.

10 Claims, 2 Drawing Sheets

U.S. PATENT DOCUMENTS

| | | | | |
|---|---|---|---|---|
| 8,089,389 | B2 * | 1/2012 | McRae | 341/173 |
| 2002/0190610 | A1 | 12/2002 | Andre et al. | 310/339 |
| 2003/0095156 | A1 * | 5/2003 | Klein et al. | 345/864 |
| 2004/0263696 | A1 * | 12/2004 | Rogers | 348/734 |
| 2004/0268391 | A1 * | 12/2004 | Clercq et al. | 725/37 |
| 2005/0179558 | A1 * | 8/2005 | Williams et al. | 340/825.69 |
| 2006/0092038 | A1 * | 5/2006 | Unger | 340/825.25 |
| 2008/0169957 | A1 * | 7/2008 | Rogers | 341/176 |
| 2008/0224915 | A1 * | 9/2008 | Unger et al. | 341/176 |
| 2012/0001149 | A1 * | 1/2012 | Menon | 257/9 |

FOREIGN PATENT DOCUMENTS

| | | |
|---|---|---|
| DE | 19721001 | 10/1998 |
| DE | 197 55 620 A1 | 6/1999 |
| DE | 19755620 | 6/1999 |

* cited by examiner

ENVIRONMENT FRIENDLY REMOTE CONTROL

This application claims the benefit, under 35 U.S.C. §119 of EP Patent Application 08305506.1, filed Aug. 28, 2008.

TECHNICAL FIELD

The present invention relates to an environment friendly remote control, in particular to a remote control according to claim 1.

BACKGROUND

In every modern household there is a plurality of remote controls which are used to control home entertainment equipment such as televisions, set-top boxes, radios, DVD players and so on. In addition to that, home appliances like air-conditioners, ceiling fans and garage doors are frequently operated by remote controls as well.

Remote controls for these applications usually transmit infrared light signals, which are invisible for the human eye, to a receiver, which is associated with the device to be controlled. Due to the widespread use of those remote controls the required components are cheap and therefore new devices are usually sold with their own remote control. The same is true for remote controls transmitting radio frequency signals.

Remote controls for these applications do not consume a lot of energy. Therefore, it is most convenient to supply the necessary energy by primary batteries. Normally, the batteries last for several years depending on the intensity of use of the remote control. However, due to unfavourable environmental conditions such as low temperatures, high humidity and last but not least the quality of the batteries there is a risk that the batteries, corrode and leak after some time. Chemicals leaking out of batteries can destroy the remote control itself.

Remote controls which are no longer operative or have become obsolete because the associated device is no longer in use are usually deposited as waste. Unfortunately, it happens many times that the remote control is deposited of together with the batteries which contain substances which are harmful for the environment.

DE 197 21 001 discloses an electronic device, which is provided with a barrel. By moving the electronic device along a surface while the barrel is in contact with the surface electrical energy can be generated. The electrical energy is sufficient to supply electronic circuitry in the electronic device. Typically the electronic device is an electronic key or a remote control.

DE 197 55 620 discloses a remote control to activate functions of vehicles. Also this remote control is provided with a mechanical generator to generate electrical energy. The electrical energy is stored in a capacitor or accumulator and supplies the electronic circuitry in the remote control.

Taking this as a starting point there is a need for a remote control which is more environment friendly than conventional remote controls.

BRIEF DESCRIPTION OF THE INVENTION

The present invention, therefore, suggests a remote control, which alleviates some drawbacks of conventional remote controls. Specifically the present invention suggests a remote control comprising an electric signal transmitter which is supplied with energy from an electrical energy storage device. The remote control comprises a generator for converting mechanical energy into electrical energy to be stored in the electrical energy storage device. The electrical energy storage device is e.g. a capacitor or a rechargeable battery. The capacitor can be a low leakage capacitor or gold capacitor. Advantageously, the rechargeable battery is a low energy battery which is mercury and lead free. The remote control is provided with a display indicating an empty electrical energy storage device. The display includes an LCD display which is covered by a mask. The mask is tinted and provided with openings. The display informs the user immediately and unambiguously about the situation that he has to recharge the energy storage of the remote control before he tries to send out a command in vain.

In a preferred embodiment of the invention the activated LCD display conceals the openings in the mask.

In another preferred embodiment of the invention the openings of the mask make an indication visible if the LCD display is not energised.

The electric signal transmitter of the remote control transmits infrared light signals or radio frequency signals.

Further advantages of the present invention will become apparent by reading the detailed description of the embodiments.

BRIEF DESCRIPTION OF THE DRAWINGS

In the drawing embodiments of the present invention are illustrated. It shows.

Similar or identical elements in the drawings are labelled with the same reference numbers.

DETAILED DESCRIPTION OF EMBODIMENTS

Figure 1:
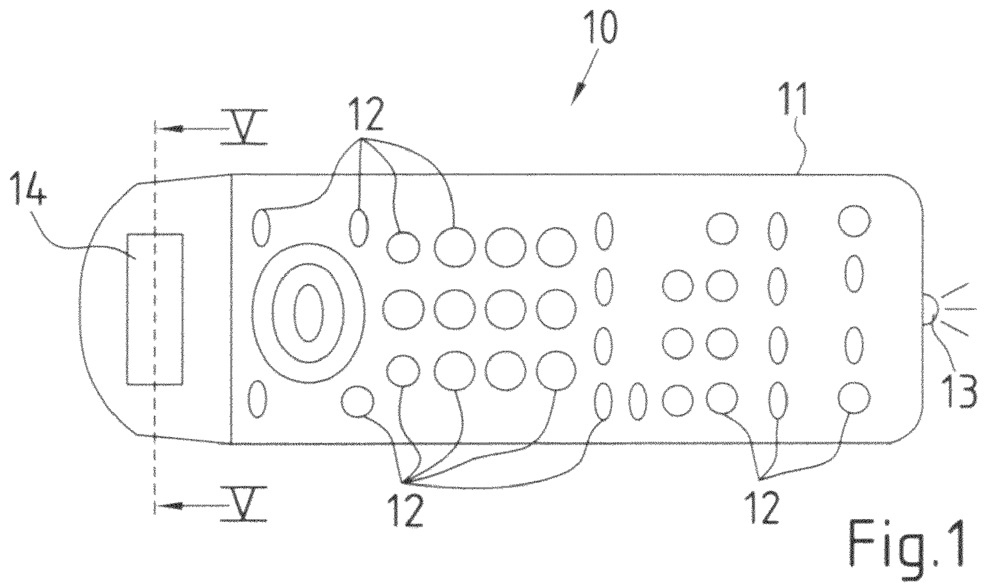
FIG. 1 a schematic view of the remote control according to the invention.

FIG. 1 shows the top view of an inventive remote control which is labelled as a whole with reference number 10. A plastic housing 11 accommodates electrical and mechanical components which will be described in more detail further below. On the top side of the housing 11 a plurality of buttons 12 are arranged enabling a user to send commands to a device. The commands are transmitted from the remote control 10 in the form of infrared pulse trains which are emitted by an infrared light emitting diode 13 arranged on a front end of the housing 11. A display element 14 is arranged on top side of the housing 11.

Figure 2A:
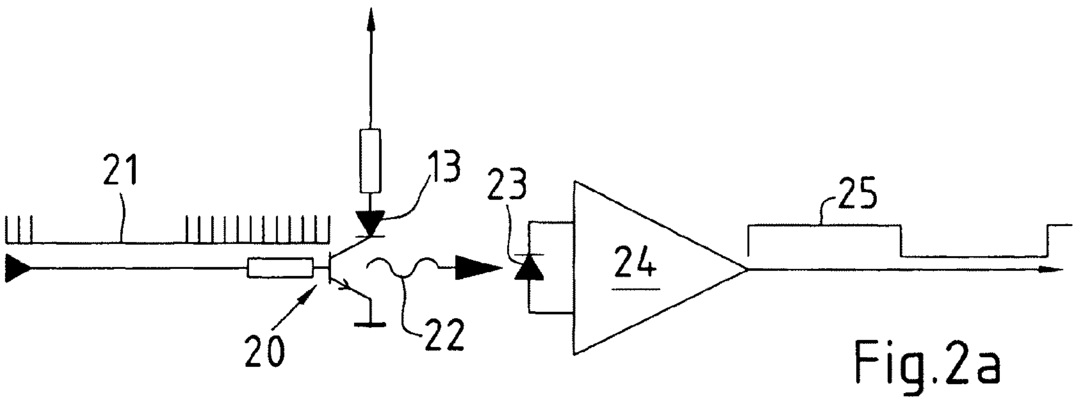
FIGS. 2*a* and 2*b* a schematic diagram illustrating the operation of the remote control in principle.

The diagram shown in FIG. 2*a* illustrates the basic operating principle of the remote control 10, which emits infrared signal commands to control devices.

The infrared LED 13 is connected to a driving circuit 20. The driving circuit drives the LED 13 with a pulse train 21. The pulse train 21 is shown in greater detail in FIG. 2*b*. Each pulse is 526 μs long 38 kHz carrier burst containing about 20 cycles. The logical "1" takes 2.10 ms to transmit which is equivalent to 80 cycles. A logical "0" is only 1.05 ms long which is equivalent to about 40 cycles. The infrared LED 13 transfers the electrical pulses into infrared light 22 which is detected by a light detecting diode 23 arranged in the device which is controlled by the remote control 10. The light detecting diode 23 converts the received infrared light 22 back into electrical signals, which are processed in a detection circuit 24. The detection circuit 24 outputs a pulse train 25 of an electrical signal, which is translated into commands on the basis of an underlying protocol. The processing is done in a circuit not shown in FIG. 2*a* for the sake of conciseness.

Figure 2B:
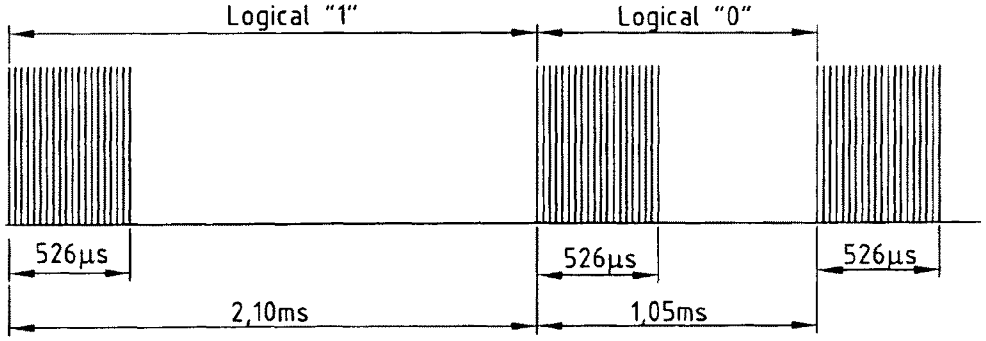

The operational concepts shown in FIGS. 2*a* and 2*b* is known in the art. In fact, the details of the concept may vary from manufacturer to manufacturer who have developed different kinds of protocols for operating devices via remote controls. However, this kind of conceptual variations are not important for the present invention.

Figure 3:
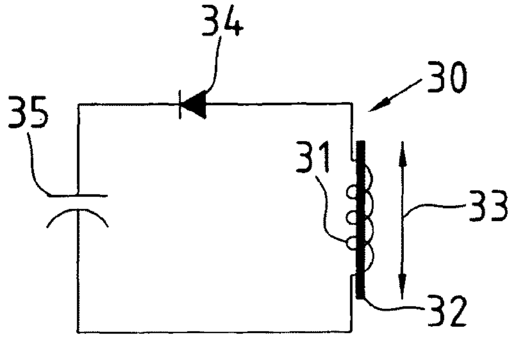
FIG. 3 a schematic diagram of the power supply of the first embodiment of the inventive remote control.

FIG. 3 shows a mechanical generator 30, which converts mechanical energy into electrical energy. The purpose of the mechanical generator 30 is to replace conventional batteries as power supply in the remote control 10. The generator 30 comprises a coil 31, in which a magnetic rod 32 is moved in an alternating manner as it is indicated in FIG. 3 by a double headed arrow 33. In this way electromagnetic induction in the coil 31 generates an alternating current which is rectified in a rectifier 34 to produce a DC current. The DC current charges a low leakage capacitor (gold capacitor) 35. The rectifier 34 is symbolized by a diode but it can be a more complex device such as a full wave rectifier. The mechanical movement can be produced by repeatedly pressing and releasing a button or a lever or simply by shaking the remote control 10. When the magnetic rod 32 moves back and forth a back EMF is generated and charges the capacitor 35. This technique of producing and storing energy is known from several other kinds of devices such as rechargeable LED torch lights and quartz watches.

Figure 4:
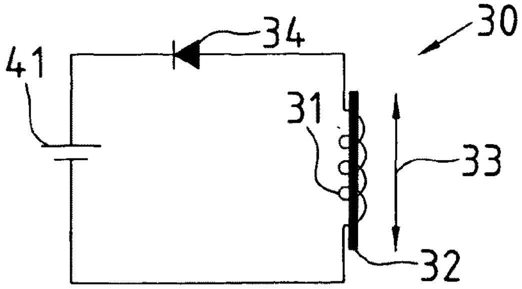
FIG. 4 a schematic diagram of the power supply of the second embodiment of the inventive remote control.

FIG. 4 shows an alternative embodiment of the generator 30. In the embodiment shown in FIG. 4 the capacitor 35 is replaced by a rechargeable lithium battery. The lithium battery 41 is a low energy battery which is mercury and lead free.

The capacitor 35 and the battery 41 are two types of electrical energy storage devices. In other embodiments of the invention a person skilled in the art may want to use other types of electrical storage devices.

Due to the low energy consumption of the remote control 10 it is sufficient if the user operates the generator 30 only from time to time. Obviously, the frequency for the need of recharging the energy storage 35 or 41 depends on how many commands the user sends with the remote control 10. If the user operates the buttons 12 of the remote control 10 and there is no reaction of the controlled device he may be confused. Only after he has realised that he has to recharge the energy storage device and after operating the generator 30 he can send out the desired command. This may be inconvenient for the user. Therefore, the remote control 10 is provided with a display 14 (FIG. 1) informing the user that he has to recharge the energy storage of the remote control 10 before he tries to send out a command in vain. The display 14 (FIG. 1) indicates the word "LOAD" when the energy storage device of the remote control is empty. It is noted that the indication appears only if the energy storage device is empty while the display is empty if the energy storage device is sufficiently loaded. This is in fact contrary to the operating principle of conventional displays.

Figure 5:
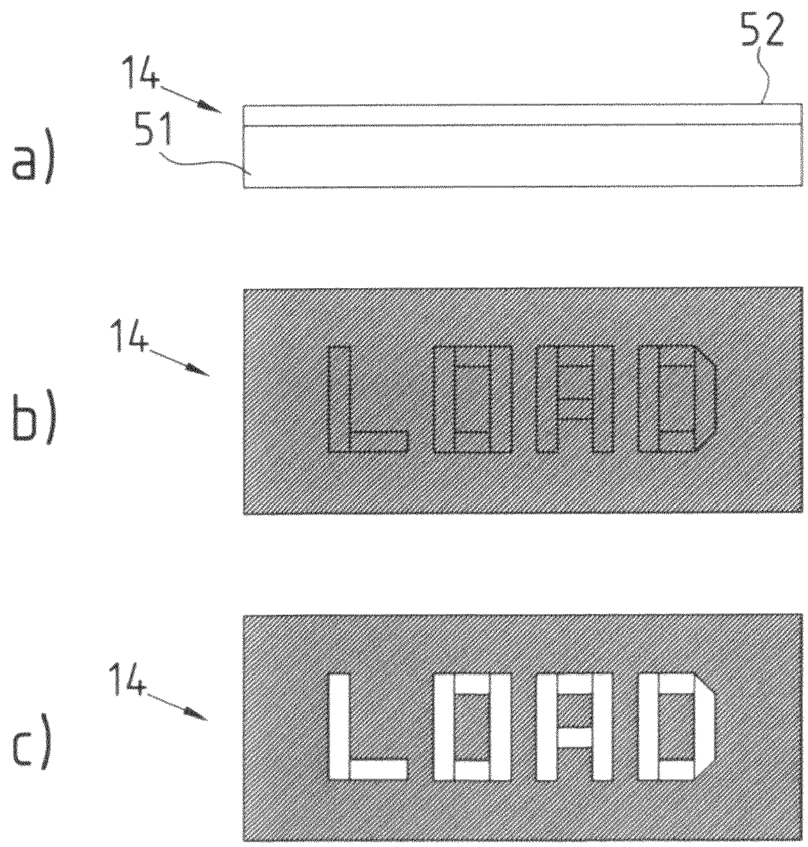
FIG. 5 a detailed partial view of the remote control of FIG. 1.

In FIGS. 5*a* to 5*c* the structure and arrangement of the display 14 are shown. FIG. 5*a* shows a cross-section of display 14. The display 14 comprises a conventional small LCD display 51 which is covered by a mask 52. The mask 52 has a dark tint similar to the tint of activated display elements of the LCD display 51. The LCD display 51 is capable of displaying dark grey segments as it is known for example from LCD alarm clocks. The tint of the mask 52 is similar to the dark grey of the switched on LCD segments.

A control circuit inside the remote control 10 which is not illustrated in the drawings controls the LCD display 51 such that the letters "LOAD" appear on the LCD display 51 if the energy storage is sufficiently loaded. As usual, outside of these letters the display remains light grey. The mask 52 on top of the LCD display 51 has openings exactly at the positions where the letters "LOAD" appear on the LCD display 51. Since the letters "LOAD" and the mask have the same colour hardly anything is visible for the user when he looks onto the display 14. The situation is shown in FIG. 5*b*. It is also possible to activate areas beneath the openings in the mask 52 instead of only activating some segments. The important point is that the activated LCD display 51 conceals the openings in the mask 52.

If the energy storage of the remote control 10 runs empty the letters on the LCD display 51 fade and the entire surface of the LCD display 51 fades into a uniform light grey. This light grey becomes visible through the openings which are cut into the mask 52 as it is shown in FIG. 5*c*. In other words, FIG. 5*c* shows the display 14 in a situation when the energy storage device of the remote control 10 is empty. The user is immediately and unambiguously informed about the situation by letters in light grey on the display 14, the remainder of which is dark grey.

The letters appear in light grey on the dark grey background of the mask 52. The LCD display 51 described so far is a reflective LCD display.

In an alternative embodiment a light-transmissive LCD display may be used, which is transparent if its segments are not activated. In order to have a sufficient light from the back onto the display 14 it is mounted in a window of the housing in 11 of the remote control 10.

In order to make the remote control according to the present invention even more environment-friendly the housing 11 of the remote control can be manufactured out of plastic which is easy to recycle, e.g. plastic, which does not contain any heavy metals.

Even though the invention has been explained by means of a remote control 10 transmitting infrared light signals the invention is not limited to certain type of emitted signals. The invention is similarly applicable to other types of remote controls transmitting other types of signals such a radio frequency signals.

The invention claimed is:

1. A remote control, comprising:

an electric signal transmitter which is supplied with energy from an electrical energy storage device;

means for detecting a state of the electrical energy storage device; and wherein the remote control is provided with a display indicating an empty electrical energy storage device, wherein the display includes an LCD display which is covered by a mask, and wherein the mask is tinted and provided with openings.

2. The remote control according to claim 1, wherein the LCD display, when activated, conceals the openings in the mask.

3. The remote control according to claim 1, wherein the openings of the mask make an indication visible if the LCD display is not energised.

4. The remote control according to claim 1, wherein the electric signal transmitter transmits infrared light signals or radio frequency signals.

5. The remote control according to claim 1, further comprising a generator for converting mechanical energy into electrical energy to be stored in the electrical energy storage device.

6. A remote control device, comprising:

means for transmitting signals;

means for detecting a state of an energy source that provides the transmitting means with energy; and means for providing a display indicating if the energy source is in an empty state, wherein the display includes an LCD display covered by a mask, and the mask is tinted and includes openings.

7. The remote control device according to claim 6, wherein the LCD display, when activated, conceals the openings in the mask.

8. The remote control device according to claim 6, wherein the openings of the mask make an indication visible if the LCD display is not energised.

9. The remote control device according to claim 6, wherein the transmitting means transmits infrared light signals or radio frequency signals.

10. The remote control device according to claim 6, further comprising means for converting mechanical energy into electrical energy to be stored in the energy source.

* * * * *